(12) United States Patent
Pietraski

(10) Patent No.: US 7,397,849 B2
(45) Date of Patent: Jul. 8, 2008

(54) CHANNEL ESTIMATION ENHANCED LMS EQUALIZER

(75) Inventor: Philip J. Pietraski, Huntington Station, NY (US)

(73) Assignee: InterDigital Technology Corporation, Wilmington, DE (US)

(*) Notice: Subject to any disclaimer, the term of this patent is extended or adjusted under 35 U.S.C. 154(b) by 112 days.

(21) Appl. No.: 11/375,919

(22) Filed: Mar. 15, 2006

(65) Prior Publication Data
US 2006/0215747 A1    Sep. 28, 2006

Related U.S. Application Data

(60) Provisional application No. 60/663,102, filed on Mar. 18, 2005.

(51) Int. Cl.
*H03H 7/30* (2006.01)
(52) U.S. Cl. .................................... 375/232
(58) Field of Classification Search ............ 375/350, 375/316, 229–234, 340, 347, 346; 708/300, 708/301, 322, 323; 333/18, 28 R
See application file for complete search history.

(56) References Cited

U.S. PATENT DOCUMENTS

| 6,608,862 B1* | 8/2003 | Zangi et al. ............. 375/232 |
| 6,618,433 B1* | 9/2003 | Yellin ..................... 375/148 |
| 6,937,676 B2* | 8/2005 | Takada et al. ........... 375/346 |
| 2006/0114974 A1* | 6/2006 | Zeira et al. ............. 375/148 |

* cited by examiner

*Primary Examiner*—Tesfaldet Bocure
(74) *Attorney, Agent, or Firm*—Volpe and Koenig, P.C.

(57) ABSTRACT

The present invention is related to an enhanced equalizer using channel estimation. A scaled version of a channel estimate is used as an expected average behavior of the product of a transmitted signal and a received signal to implement Griffith algorithm. The present invention also uses advance or prediction of a channel estimate to overcome the lag problem inherent in a least means square (LMS) algorithm in a time varying channel. Therefore, the present invention enables the use of a small step size while attaining the same tracking capability with a large step size. A channel estimate at some time in the future is used for updating equalizer filter tap coefficients. This may be performed with a prediction filter. Alternatively, a delay may be introduced in the input data to the filter tap coefficient generator, which makes a channel estimate look like a prediction to the filter tap coefficient generator.

23 Claims, 5 Drawing Sheets

CHANNEL ESTIMATION ENHANCED LMS EQUALIZER

CROSS REFERENCE TO RELATED APPLICATIONS

This application claims the benefit of U.S. provisional application No. 60/663,102 filed Mar. 18, 2005, which is incorporated by reference as if fully set forth.

FIELD OF INVENTION

The present invention is related to a wireless communication system. More particularly, the present invention is related to a channel estimation enhanced LMS equalizer.

BACKGROUND

One of the methods for adjusting filter coefficients of an adaptive filter is a least mean square (LMS) algorithm. In an LMS filter, the filter coefficients are updated based on an error between an actual output of the LMS filter and a reference value. The error is fed back to update the filter coefficients and updated filter coefficients are generated based on a step size and the error, which is iteratively updated until convergence is obtained.

Performance of an LMS equalizer, (or a normalized LMS (NLMS) equalizer), is degraded in quickly varying channels if a small step size is used since the speed of convergence does not keep up with the quickly changing channel. Using a large step size may increase convergence speed, and therefore may enhance the performance of the LMS equalizer. However, using a large step size may cause excessive misadjustment errors. Therefore, there is a trade-off between tracking capability and misadjustment errors. A large step size is preferable to track the channel better. However, a small step size is preferable to reduce the misadjustment errors. Therefore, step size is set to optimize the overall performance, but nevertheless implementation of the LMS algorithm often results in sub-optimal convergence time.

The Griffith algorithm is based on an adaptation of the LMS algorithm that does not require an error signal but requires apriori knowledge of an expected value of a product of a reference signal and a data vector.

It would therefore be desirable to perform channel estimation without the limitations of the prior art.

SUMMARY

The present invention is related to an enhanced equalizer using channel estimation. In accordance with the present invention, a scaled version of a channel estimate is used as an expected average behavior of the product of the transmitted signal and the received signal to implement Griffith algorithm. The present invention also uses advance or prediction of a channel estimate to overcome the lag problem inherent in the LMS algorithm variants in a time varying channel. Therefore, the present invention enables the use of a small step size while attaining the same tracking capability with a large step size. A channel estimate at some time in the future is used for updating equalizer filter tap coefficients. This may be performed with a prediction filter. Alternatively, a delay may be introduced in the input data to the filter tap coefficient generator, which makes a channel estimate look like a prediction to the filter tap coefficient generator since the input data to the filter tap coefficient generator is delayed.

DETAILED DESCRIPTION OF THE PREFERRED EMBODIMENTS

Figure 1:
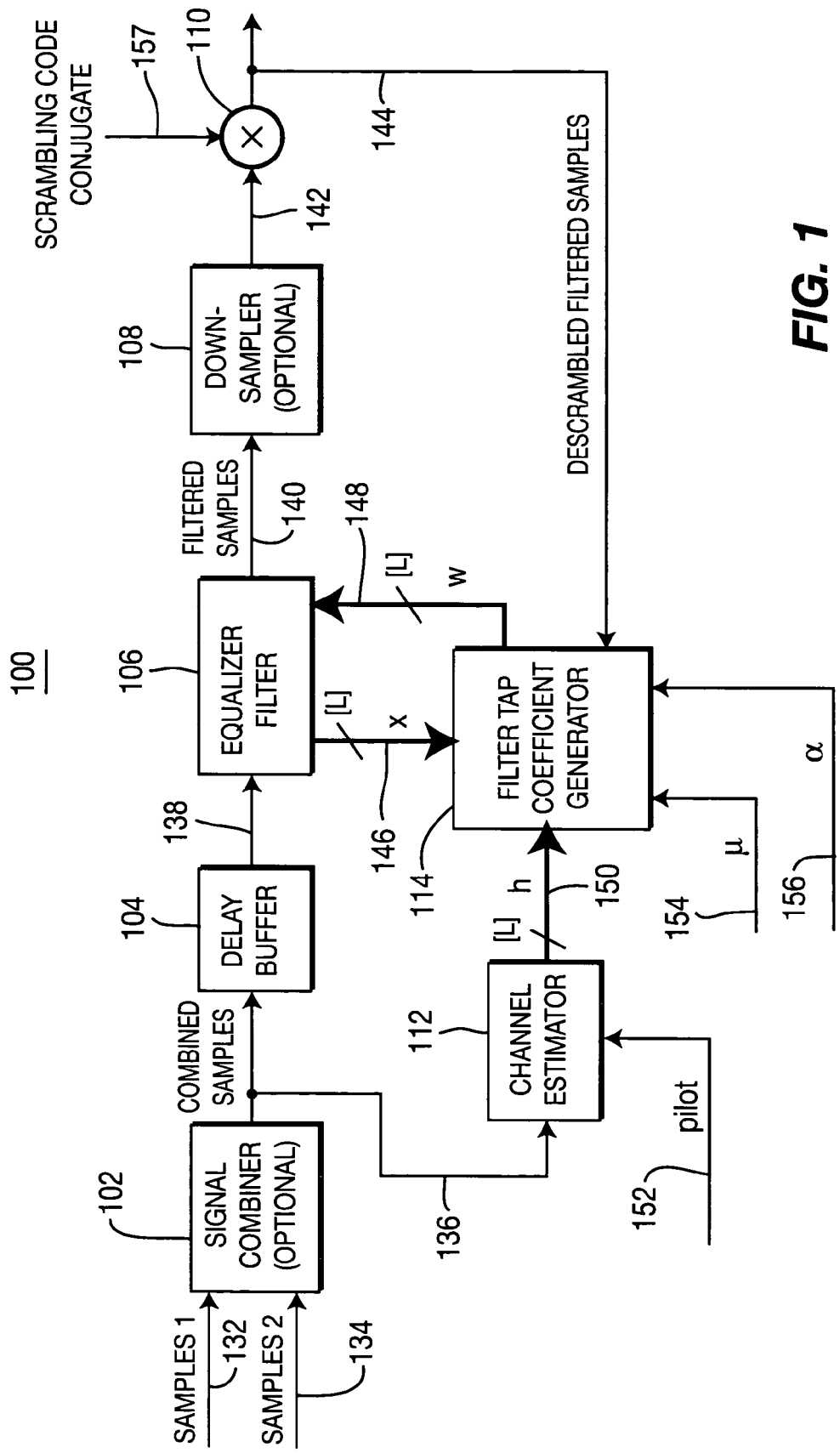
FIG. 1 is a block diagram of an equalizer in accordance with the present invention.

The features of the present invention may be incorporated into an integrated circuit (IC) or be configured in a circuit comprising a multitude of interconnecting components.

The present invention provides an equalizer, (i.e., an adaptive filter), that better tracks high mobility channels while maintaining good convergence properties. The Griffith algorithm was devised to permit an LMS-like algorithm to be used in the absence of an error signal (in the context of adapting antenna arrays to reject interferers) but requires that the expected average behavior of the product of the transmitted signal and the received signal be known. In general, this expected behavior is not known at the receiver. In accordance with the present invention, the behavior is estimated and the estimation is used to implement the Griffith algorithm. In accordance with one embodiment of the present invention, a scaled version of a channel estimate is used as the expected average behavior of the product of the transmitted signal and the received signal. The channel estimate can be easily obtained if a known pilot sequence is embedded in the transmission, (e.g., by correlating the received signal with the known pilot signal).

The present invention also uses advance or prediction of a channel estimate to overcome the lag problem inherent in the LMS algorithm in a time varying channel, thereby permitting the use of a small step size while attaining the same tracking capability with a large step size. In accordance with the present invention, a channel estimate at some time in the future is used for updating equalizer filter tap coefficients. This may be performed with a prediction filter. Alternatively, a delay may be introduced in the input data to the filter tap coefficient generator, which makes a channel estimate look like a prediction to the filter tap coefficient generator since the input data to the filter tap coefficient generator is delayed.

Update of filter tap coefficients of an equalizer filter in accordance with a leaky NLMS algorithm can be written as follows:

$$\vec{w}_k = \alpha \vec{w}_{k-1} + \frac{\mu}{\|\vec{X}_k\|^2} e_k \left( c_k \vec{X}_k \right)^H ; \quad \text{Equation (1)}$$

where an error signal $e_k = (1+j) - y_k c_k$, $\alpha$ is a leakage factor, $\vec{w}$ is the equalizer filter tap coefficients, $\vec{X}$ is a vector of input data in the equalizer filter, y is the equalizer filter output, $y = \vec{X} \vec{w}$, c is a conjugate of the scrambling code and the subscript k means a k-th iteration.

Denoting the product yc=eq_descram, and letting $$\beta = \frac{\mu}{\|\vec{X}_k\|^2}$$

and a pilot signal p={1+j}, Equation (1) can then be rewritten as follows:

$$\vec{w}_k = \alpha \vec{w}_{k-1} + \beta [p(c_k\vec{X}_k)^H - y_k c_k(c_k\vec{X}_k)^H]. \quad \text{Equation (2)}$$

Denoting $(c_k\vec{X}_k)$=sym_vec, Equation (2) can then be rewritten as follows:

$$\vec{w}_k = \alpha \vec{w}_{k-1} + \beta(p \cdot \text{sym\_vec}^H - \text{eq\_descram} \cdot \text{sym\_vec}^H). \quad \text{Equation (3)}$$

The enhancement to the NLMS algorithm in accordance with the present invention is made by replacing the left term in the ( ) of Equation (3) with its expectation as follows:

$$\vec{w}_k = \alpha \vec{w}_{k-1} + \beta(E\{p \cdot \text{sym\_vec}^H\} - \text{eq\_descram} \cdot \text{sym\_vec}^H). \quad \text{Equation (4)}$$

In accordance with the present invention, the expectation is approximated from a channel estimate. The term in the expectation would yield the channel impulse response in a noiseless case if only a pilot were transmitted. Therefore, a channel estimate may replace the expectation in Equation (4). In addition, rather than simply computing a channel estimate to substitute for the expectation, a predicted channel estimate is used. If the channel estimate is replaced with an estimate of the channel state at some future time, additional performance improvements can be realized. This compensates for the inherent lag in the NLMS algorithm. As stated above, the prediction may be implemented by a delay placed in front of the equalizer filter.

FIG. 1 is a block diagram of an equalizer 100 in accordance with the present invention. The equalizer 100 includes an equalizer filter 106, a channel estimator 112, a filter tap coefficient generator 114 and a multiplier 110. The equalizer 100 may optionally further include a delay buffer 104, a signal combiner 102 and a down-sampler 108.

Digitized samples 132, 134 are fed into the signal combiner 102. The present invention can be extended to implement receive diversity using multiple antennas. Multiple sample streams, such as samples 132, 134, may be generated from received signals via multiple antennas, and the multiple streams of samples 132, 134 are multiplexed by the signal combiner 102 to generate one combined sample stream 136. It should be noted that FIG. 1 depicts two sample streams 132, 134 from two receive antennas (not shown) as an example, but just one or more than two sample streams may be generated depending on antenna configuration. If just one sample stream is generated, the signal combiner 102 is not necessary and the sample stream is directly fed into the delay buffer 104 and the channel estimator 112. The signal combiner 102 may simply interleave the samples 132, 134 alternately to generate one stream of samples 136.

The combined samples 136 are fed into the delay buffer 104 and the channel estimator 112. The delay buffer 104 stores the combined samples 136 for delaying for a predetermined period of time before outputting delayed combined samples 139 to the equalizer filter 106. This makes a channel estimate look like a prediction to the filter tap coefficient generator. Alternatively, the samples 136 may be directly fed to the equalizer filter 106. The equalizer filter 106 processes the delayed combined samples 138 using filter tap coefficients 148 updated by the filter tap coefficients generator 114 and outputs filtered samples 140.

The filtered samples 140 may be down-sampled by the down-sampler 108 if the sampling rate is greater than a chip rate or multiple sample streams are generated, thereby the down-sampler 108 generates a chip rate data. Preferably, the samples 132, 134 are generated at twice the chip rate. For example, if two sample streams are generated at twice the chip rate, the down-sampler 108 down-samples the filtered samples 140 by a factor of four (4).

The down-sampled samples 142 are then descrambled by multiplying the down-sampled samples 142 with the conjugate of the scrambling code 157 with the multiplier 110. The descrambled filtered samples 144 are output from the equalizer 100 to be processed by other components downstream and are also fed back to the filter tap coefficients generator 114.

The channel estimator 112 receives, as input, combined samples 136 and preferably a pilot sequence 152 and outputs a channel estimate 150. The channel estimate may be generated by using any prior art methods. When a pilot signal is included in the received signals, knowledge of that pilot signal enhances channel estimation.

The filter tap coefficients generator 114 generates the filter tap coefficients 148 to be used in filtering the combined samples 138 in the equalizer filter 106. The filter tap coefficients generator 114 takes as an input, the descrambled filtered samples 144, the state vector of the samples in the tapped delay line 146, the channel estimate 150 generated by the channel estimator 112, a step size parameter $\mu$ 154 and a leakage parameter $\alpha$ 156.

Figure 2:
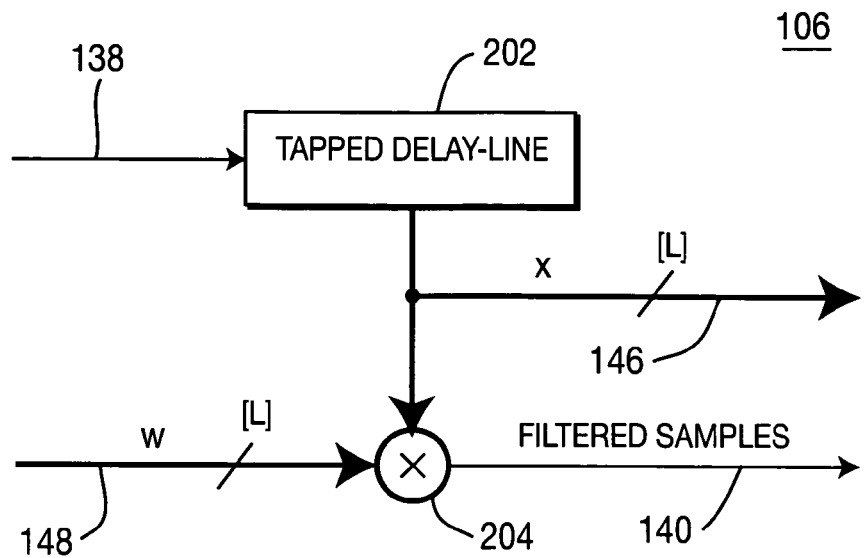
FIG. 2 is a block diagram of an equalizer filter of FIG. 1.

FIG. 2 is a detailed block diagram of the equalizer filter 106. The equalizer filter 106 comprises a tapped delay line 202 and a vector inner product multiplier 204. The delayed combined samples 138 are shifted into the tapped delay line 202 and the vector inner product multiplier 204 computes a vector inner product of a state vector 146 of the samples shifted into the tapped delay line and complex filter tap coefficients 148. The vector inner product is output from the equalizer filter 106 as the filtered sample 140.

Figure 3:
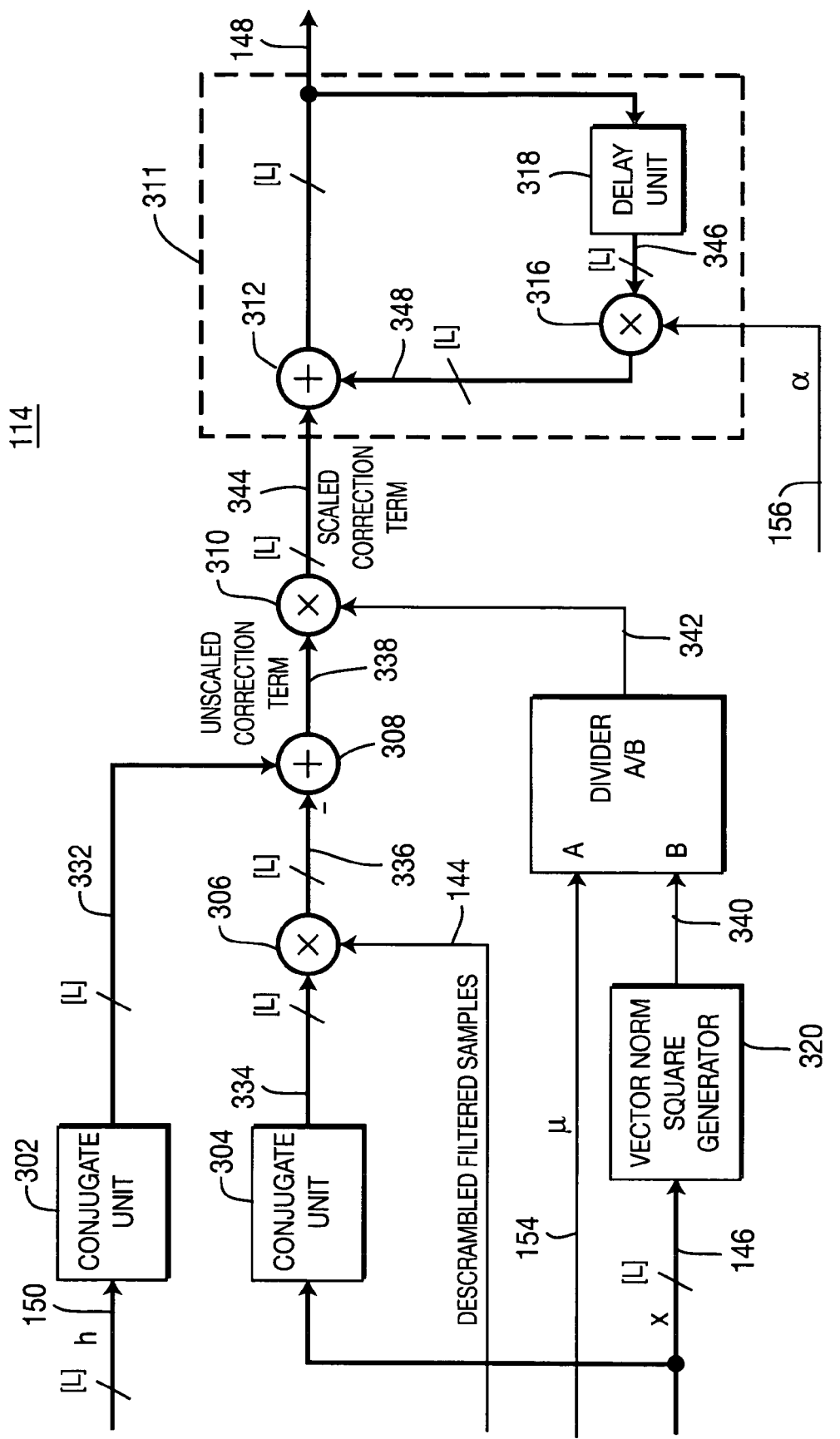
FIG. 3 is a block diagram of a filter tap coefficient generator of FIG. 1.

FIG. 3 is a detailed block diagram of the filter tap coefficients generator 114. The filter tap coefficients generator 114 comprises a first conjugate unit 302, a second conjugate unit 304, a first multiplier 306, an adder 308, a second multiplier 310, a vector norm square generator 320, a divider 314 and a loop filter 311. The channel estimate 150 generated by the channel estimator 112 is fed to the first conjugate unit 302 to generate a conjugate of the channel estimate 332. The state vector 146 of the samples in the tapped delay line 202 of the equalizer filter 106 is fed to the second conjugate unit 304 to generate a conjugate of the state vector 334. The conjugate of the state vector 334 and descrambled filtered samples 144 are multiplied by the first multiplier 306. The first multiplier 306 is a scalar-vector multiplier 305 producing a vector signal. The output 336 of the first multiplier 306 is subtracted from the conjugate of the channel estimate 332 by the adder 308 to generate an unscaled correction term 338, which corresponds to the term $(E\{p \cdot \text{sym\_vec}^H\} - \text{eq\_descram} \cdot \text{sym\_vec}^H)$ in Equation (4).

The state vector 146 is also fed to the vector norm square generator 320 to compute a vector norm square of the state vector 340. The step size parameter $\mu$ 154 is divided by the vector norm square of the state vector 340 by the divider 314 to generate a scaling factor 342, (i.e., $\beta$ in Equation (4)). The scaling factor 342 is multiplied to the unscaled correction term 338 by the second multiplier 310 to generate a scaled correction term 344. The scaled correction term 344 is fed to the loop filter 311 to be added to the filter tap coefficients of the previous iteration to produce updated filter tap coefficients 148.

The loop filter 311 comprises an adder 312, a delay unit 318 and a multiplier 316. The filter tap coefficients 148 are stored in the delay unit 318 to be used in the next iteration as a previous filter tap coefficients. The delayed filter tap coefficients 346 are multiplied by the leakage parameter α 156 to produce scaled previous filter tap coefficients 348, and the scaled previous filter tap coefficients 348 are added to the scaled correction term 344 by the adder 312 to generate filter tap coefficients 148.

Figure 4:
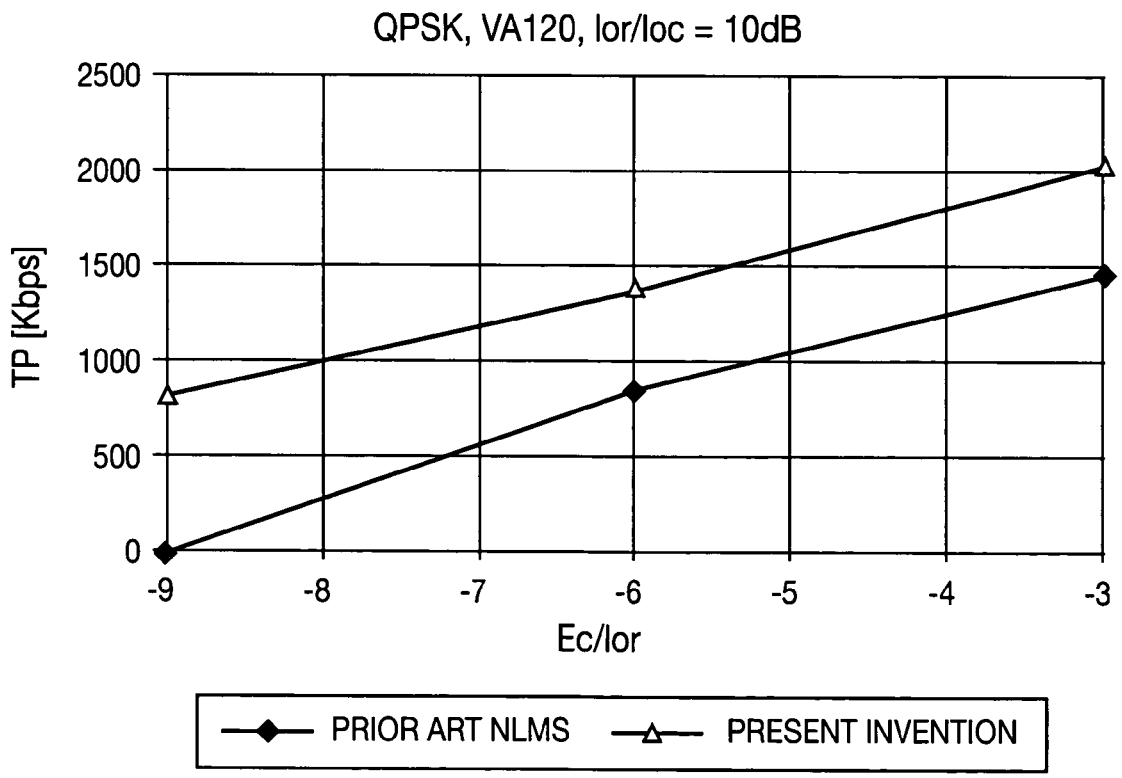
FIG. 4 shows simulation results showing performance improvement compared to a prior art NLMS equalizer.

The performance improvement in accordance with the present invention is shown in FIG. 4 as simulation results. The simulation is configured for a signal-to-noise ratio (SIR) of 10 dB, a quadrature phase shift keying (QPSK) modulation, one receive antenna with ITU VA120 channel and 3G high speed downlink packet access (HSDPA) fixed reference channel (FRC) test. The simulations show the advantage of the present invention in a high mobility channel (120 kph mobile speed). More than 2 dB performance improvement is realized.

Figure 5:
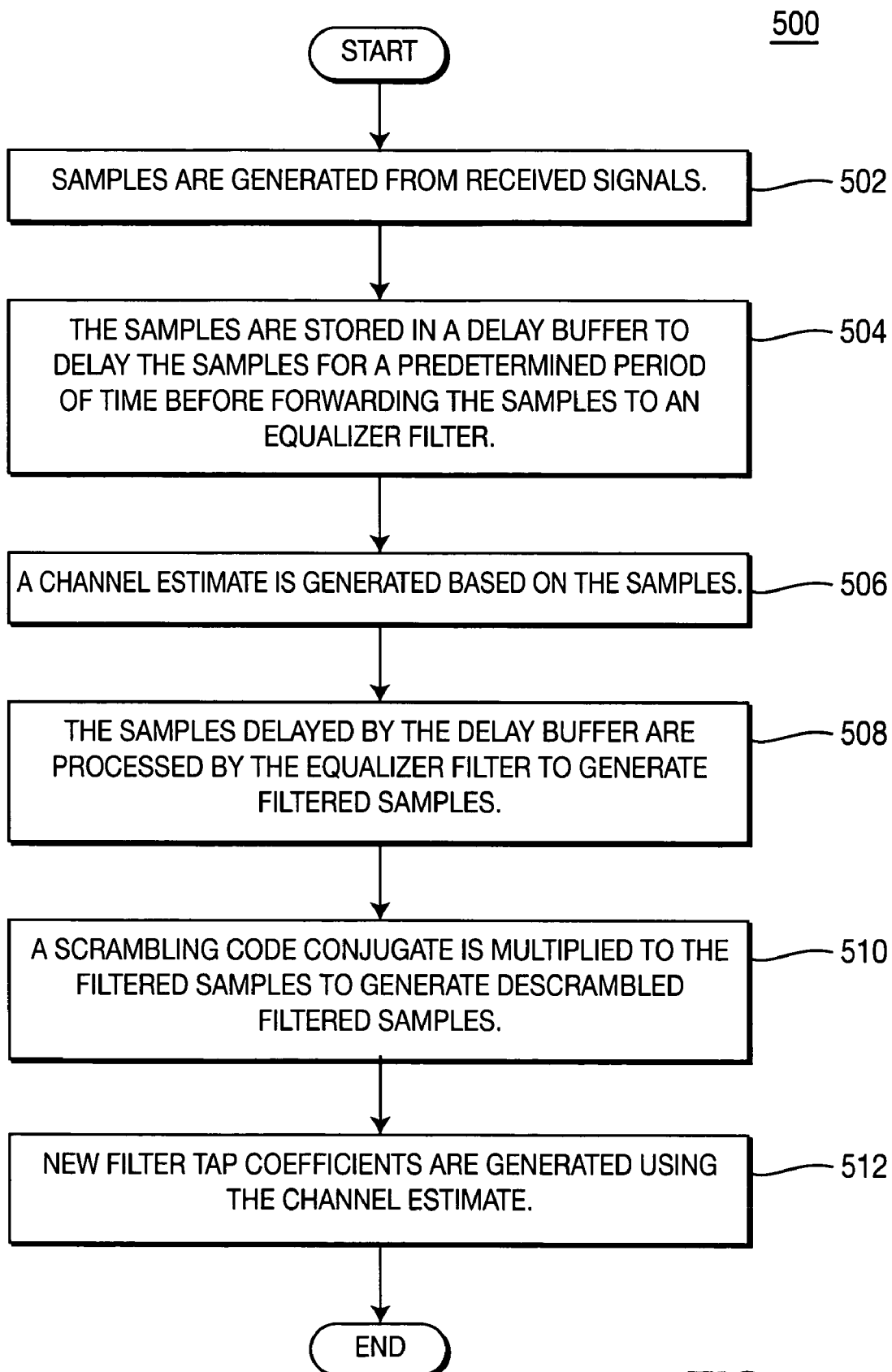
FIG. 5 is a flow diagram of a process for performing equalization of received signals in accordance with the present invention.

FIG. 5 is a flow diagram of a process 500 for performing equalization of received signals in accordance with the present invention. Samples are generated from received signals (step 502). The samples are stored temporarily in a delay buffer to delay the samples for a predetermined period of time before forwarding the samples to an equalizer filter (step 504). A channel estimate is generated based on the samples (step 506). The samples delayed by the delay buffer are processed by the equalizer filter to generate filtered samples (step 508). A scrambling code conjugate is multiplied to the filtered samples to generate descrambled filtered samples (step 510). New filter tap coefficients are generated using the channel estimate (step 512).

Figure 6:
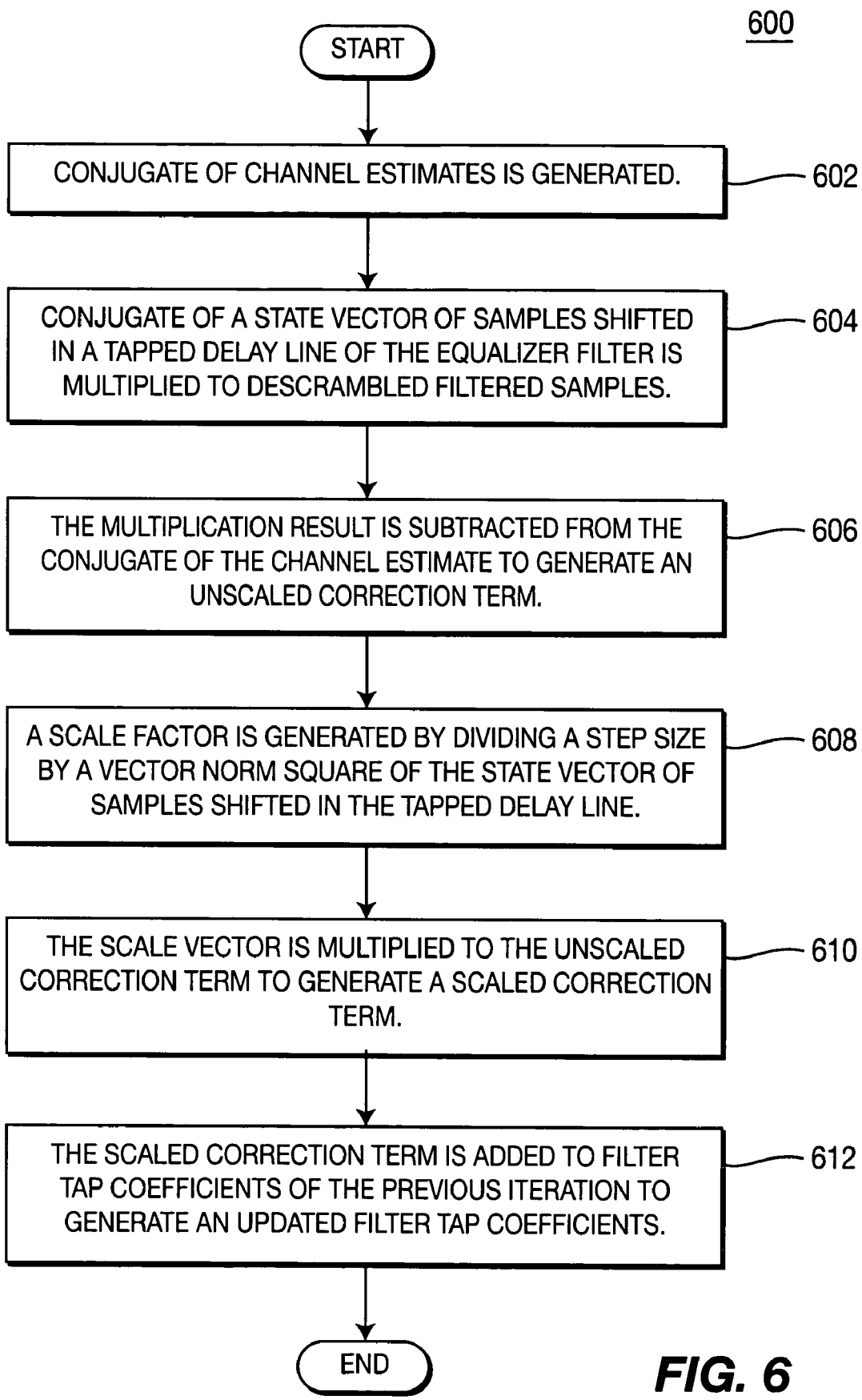
FIG. 6 is a flow diagram of a process for generating filter tap coefficients in accordance with the present invention.

FIG. 6 is a flow diagram of a process 600 for generating filter tap coefficients in accordance with the present invention. Conjugate of channel estimates is generated (step 602). Conjugate of a state vector of samples shifted in a tapped delay line of the equalizer filter is multiplied to descrambled filtered samples (step 604). The multiplication result is subtracted from the conjugate of the channel estimate to generate an unscaled correction term (step 606). A scale factor is generated by dividing a step size by a vector norm square of the state vector of samples shifted in the tapped delay line (step 608). The scale vector is multiplied to the unscaled correction term to generate a scaled correction term (step 610). The scaled correction term is added to filter tap coefficients of the previous iteration to generate an updated filter tap coefficients (step 612).

Although the features and elements of the present invention are described in the preferred embodiments in particular combinations, each feature or element can be used alone without the other features and elements of the preferred embodiments or in various combinations with or without other features and elements of the present invention.

What is claimed is:

1. An equalizer comprising:
   a channel estimator for generating a channel estimate;
   an equalizer filter for processing samples with filter tap coefficients to generate filtered samples;
   a delay buffer to delay the samples for a predetermined period of time before the samples are forwarded to the equalizer filter; and
   a filter tap coefficients generator for updating the filter tap coefficients using the channel estimate.

2. The equalizer of claim 1 wherein the equalizer filter comprises:
   a tapped delay line, the samples being shifted into the tapped delay line sequentially; and
   a vector inner product multiplier for computing a vector inner product of the samples shifted into the tapped delay line and the filter tap coefficients.

3. The equalizer of claim 2 wherein the filter tap coefficients generator computes a new set of filter tap coefficients based on descrambled filtered samples, a state vector of samples shifted into the tapped delay line and the channel estimate.

4. The equalizer of claim 3 wherein the filter tap coefficients generator comprises:
   a first conjugate unit for generating a conjugate of the channel estimate;
   a second conjugate unit for generating a conjugate of the state vector of samples shifted into the tapped delay line;
   a first multiplier for multiplying the descrambled filtered samples to the conjugate of the state vector;
   an adder for subtracting output of the first multiplier from the conjugate of the channel estimate to generate an unscaled correction term;
   a vector norm square generator for computing a vector norm square of the state vector;
   a divider for dividing a step size parameter by the vector norm square to generate a scaling factor;
   a second multiplier for multiplying the scaling factor to the unscaled correction term to generate a scaled correction term; and
   a loop filter for storing the filter tap coefficients of a previous iteration and outputting new filter tap coefficients by adding the scaled correction term to the filter tape coefficients of the previous iteration.

5. The equalizer of claim 4 wherein the filter tap coefficients generator further comprises a third multiplier for multiplying a leakage parameter to the filter tap coefficients of the previous iteration.

6. The equalizer of claim 1 further comprising a down-sampler for down-sampling the filtered samples, whereby the down-sampler outputs filtered samples at a chip rate.

7. The equalizer of claim 6 further comprising a signal combiner for combining multiple streams of samples generated based on signals received through a plurality of antennas.

8. The equalizer of claim 7 wherein the signal combiner interleaves the multiple streams of samples to generate a combined stream of samples.

9. A method for performing equalization on received signals, the method comprising:
   generating samples of received signals;
   generating a channel estimate based on the samples;
   storing the samples in a delay buffer to delay the samples for a predetermined period of time before forwarding the samples to an equalizer filter;
   processing the samples with the equalizer filter to generate filtered samples; and
   generating new filter tap coefficients of the equalizer filter using the channel estimate.

10. The method of claim 9 wherein the new filter tap coefficients are generated based on descrambled filtered samples, a state vector of samples shifted into a tapped delay line of the equalizer filter and the channel estimate.

11. The method of claim 9 further comprising down-sampling the filtered samples to generate filtered samples at a chip rate.

12. The method of claim 11 further comprising combining multiple streams of samples generated based on signals received through a plurality of antennas.

13. The method of claim 12 wherein the multiple streams of samples are interleaved to generate a combined stream of samples.

14. An integrated circuit (IC) for equalization, the IC comprising:
a channel estimator for generating a channel estimate;
an equalizer filter for processing samples with filter tap coefficients to generate filtered samples;
a delay buffer to delay the samples for a predetermined period of time before the samples are forwarded to the equalizer filter; and
a filter tap coefficients generator for updating the filter tap coefficients using the channel estimate.

15. The IC of claim 14 wherein the equalizer filter comprises:
a tapped delay line, the samples being shifted into the tapped delay line sequentially; and
a vector inner product multiplier for computing a vector inner product of the samples shifted into the tapped delay line and the filter tap coefficients.

16. The IC of claim 15 wherein the filter tap coefficients generator computes a new set of filter tap coefficients based on descrambled filtered samples, a state vector of samples shifted into the tapped delay line and the channel estimate.

17. The IC of claim 16 wherein the filter tap coefficients generator comprises:
a first conjugate unit for generating a conjugate of the channel estimate;
a second conjugate unit for generating a conjugate of the state vector;
a first multiplier for multiplying the descrambled filtered samples to the conjugate of the state vector;
an adder for subtracting output of the first multiplier from the conjugate of the channel estimate to generate an unscaled correction term;
a vector norm square generator for computing a vector norm square of the state vector;
a divider for dividing a step size parameter by the vector norm square to generate a scaling factor;
a second multiplier for multiplying the scaling factor to the unscaled correction term to generate a scaled correction term; and
a loop filter for storing the filter tap coefficients of a previous iteration and outputting new filter tap coefficients by adding the scaled correction term to the filter tape coefficients of the previous iteration.

18. The IC of claim 17 wherein the filter tap coefficients generator further comprises a third multiplier for multiplying a leakage parameter to the filter tap coefficients of the previous iteration.

19. The IC of claim 14 further comprising a down-sampler for down-sampling the filtered samples, whereby the down-sampler outputs filtered samples at a chip rate.

20. The IC of claim 19 further comprising a signal combiner for combining multiple streams of samples generated based on signals through a plurality of antennas.

21. The IC of claim 20 wherein the signal combiner interleaves the multiple streams of samples to generate a combined stream of samples.

22. A filter tap coefficient generator for generating filter tap coefficients for an adaptive filter, the filter tap coefficient generator comprising:
a first conjugate unit for generating a conjugate of channel estimate;
a second conjugate unit for generating a conjugate of a state vector of samples shifted into a tapped delay line of an adaptive filter;
a first multiplier for multiplying descrambled filtered samples to the conjugate of the state vector;
an adder for subtracting output of the first multiplier from the conjugate of the channel estimate to generate an unscaled correction term;
a vector norm square generator for computing a vector norm square of the state vector;
a divider for dividing a step size parameter by the vector norm square to generate a scaling factor;
a second multiplier for multiplying the scaling factor to the unscaled correction term to generate a scaled correction term; and
a loop filter for storing filter tap coefficients of a previous iteration and outputting updated filter tap coefficients by adding the scaled correction term to the filter tape coefficients of the previous iteration.

23. A method for generating filter tap coefficient for an adaptive filter, the method comprising:
generating conjugate of channel estimates;
multiplying conjugate of a state vector of samples shifted in a tapped delay line of an adaptive filter to descrambled filtered samples;
subtracting multiplication result from the conjugate of the channel estimate to generate an unscaled correction term;
generating a scale factor by dividing a step size by a vector norm square of the state vector of samples shifted in the tapped delay line;
multiplying the scale factor to the unscaled correction term to generate a scaled correction term; and
adding the scaled correction term to filter tap coefficients of a previous iteration to generate an updated filter tap coefficients.

* * * * *

UNITED STATES PATENT AND TRADEMARK OFFICE
CERTIFICATE OF CORRECTION

PATENT NO. : 7,397,849 B2  
APPLICATION NO. : 11/375919  
DATED : July 8, 2008  
INVENTOR(S) : Philip J. Pietraski Page 1 of 1

It is certified that error appears in the above-identified patent and that said Letters Patent is hereby corrected as shown below:

At claim 4, column 6, line 34, after the words "the filter", delete "tape" and insert therefor --tap--.

At claim 17, column 7, line 48, after the words "the filter", delete "tape" and insert therefor --tap--.

At claim 22, column 8, line 33, after the words "the filter", delete "tape" and insert therefor --tap--.

At claim 23, column 8, line 35, after the words "filter tap", delete "coefficient" and insert therefor --coefficients--.

At claim 23, column 8, delete line 51 and insert therefor --coefficient--.

Signed and Sealed this

Twenty-first Day of October, 2008

JON W. DUDAS
*Director of the United States Patent and Trademark Office*